(12) United States Patent
Lueders et al.

(10) Patent No.: US 12,062,995 B2
(45) Date of Patent: Aug. 13, 2024

(54) SYNCHRONOUS BOOTSTRAP HALF BRIDGE RECTIFIER

(71) Applicant: Texas Instruments Incorporated, Dallas, TX (US)

(72) Inventors: Michael Lueders, Freising (DE); Cetin Kaya, Plano, TX (US); Johan Strydom, Saratoga, CA (US); Paul Brohlin, Parker, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 204 days.

(21) Appl. No.: 17/873,395

(22) Filed: Jul. 26, 2022

(65) Prior Publication Data

US 2023/0038798 A1    Feb. 9, 2023

Related U.S. Application Data

(60) Provisional application No. 63/229,754, filed on Aug. 5, 2021.

(51) Int. Cl.
  *H02M 7/219* (2006.01)
  *H02M 1/08* (2006.01)

(52) U.S. Cl.
  CPC ............ *H02M 7/219* (2013.01); *H02M 1/08* (2013.01)

(58) Field of Classification Search
  CPC .............................. H02M 1/08; H02M 7/219
  See application file for complete search history.

(56) References Cited

U.S. PATENT DOCUMENTS

| | | | |
|---|---|---|---|
| 6,646,508 B1 * | 11/2003 | Barbetta | H03F 3/3018 330/264 |
| 9,331,689 B2 | 5/2016 | Koyama et al. | |
| 9,571,093 B2 | 2/2017 | Kinzer et al. | |
| 9,929,652 B1 | 3/2018 | Ribarich et al. | |
| 9,960,620 B2 | 5/2018 | Kinzer et al. | |
| 10,333,327 B2 | 6/2019 | Kinzer et al. | |
| 10,601,302 B1 | 3/2020 | Sharma et al. | |
| 10,673,426 B2 | 6/2020 | Ming et al. | |
| 10,756,725 B2 | 8/2020 | Jordanger | |
| 10,778,219 B2 | 9/2020 | Sharma et al. | |
| 10,804,894 B1 | 10/2020 | Todaka | |
| 10,811,951 B1 | 10/2020 | Sharma et al. | |

(Continued)

*Primary Examiner* — Kyle J Moody
*Assistant Examiner* — Lakaisha Jackson
(74) *Attorney, Agent, or Firm* — Ray A. King; Frank D. Cimino

(57) ABSTRACT

Described embodiments include a rectifier circuit comprising a first resistor with first and second resistor terminals, and a second resistor with third and fourth resistor terminals. The first and third resistor terminals are coupled to an auxiliary power terminal. A current source is coupled between the second resistor terminal and a ground terminal. An amplifier has a first amplifier input coupled to the second resistor terminal, and a second amplifier input coupled to the fourth resistor terminal. A first transistor is coupled between the fourth resistor terminal and a damping terminal, and has a first control terminal coupled to the first amplifier output. A gate drive circuit has an input coupled to the damping terminal. A second transistor is coupled between the damping terminal and a bootstrap supply terminal, and has a second control terminal coupled to an output of the gate drive circuit.

20 Claims, 3 Drawing Sheets

(56) References Cited

U.S. PATENT DOCUMENTS

| | | |
|---|---|---|
| 10,897,142 B2 | 1/2021 | Kinzer et al. |
| 10,911,045 B1 | 2/2021 | Ming et al. |
| 2005/0168206 A1* | 8/2005 | Nadd ................ H02M 1/08 323/285 |
| 2008/0018364 A1* | 1/2008 | Clarkin ............ H03K 17/133 327/110 |
| 2017/0070220 A1 | 3/2017 | Yoshida et al. |
| 2020/0153338 A1* | 5/2020 | Ribarich ............ H03K 17/06 |
| 2021/0143647 A1 | 5/2021 | Kinzer et al. |
| 2022/0321116 A1* | 10/2022 | Niikura ......... H03K 17/0822 |

* cited by examiner

SYNCHRONOUS BOOTSTRAP HALF BRIDGE RECTIFIER

CROSS-REFERENCE TO RELATED APPLICATION

This application claims priority to U.S. Provisional Patent Application No. 63/229,754 filed Aug. 5, 2021, which is incorporated herein by reference.

BACKGROUND

This description relates to voltage conversion circuits, and in particular to the use of synchronous bootstrap half-bridge rectifiers in offline switching voltage converters. Offline switching voltage converters are designed to receive and process electrical power directly from an AC utility power source. A typical offline switching voltage converter rectifies an AC line voltage input, transforms the input from one voltage level to another using inductors and/or transformers, rectifies the signal, then filters the signal to produce a regulated DC output. An example of an offline switching voltage converter is a switching power supply for a computer.

A bootstrap circuit can be used with a half-bridge to generate a high-side bias voltage for driving the gate of a high-side field effect transistor (FET) that is referenced to a switch node of the half bridge. An example implementation of a conventional bootstrap circuit includes a bootstrap capacitor that provides a low impedance path for sourcing relatively high peak currents to charge a high-side switch, a diode for rectification, a resistor to limit the peak current at the bootstrap diode during start-up, and a bypass capacitor to filter and reduce noise.

SUMMARY

In a first example, a rectifier circuit includes a first resistor having first and second resistor terminals. The first resistor terminal is coupled to an auxiliary power terminal. A second resistor has third and fourth resistor terminals. The third resistor terminal is coupled to the auxiliary power terminal. A current source is coupled between the second resistor terminal and a ground terminal. An amplifier has first and second amplifier inputs and a first amplifier output. The first amplifier input is coupled to the second resistor terminal, and the second amplifier input is coupled to the fourth resistor terminal.

A first transistor is coupled between the fourth resistor terminal and a damping terminal, and has a first control terminal coupled to the first amplifier output. A gate drive circuit has a gate drive input and a gate drive output. The gate drive input is coupled to the damping terminal. A second transistor is coupled between the damping terminal and a bootstrap supply terminal, and has a second control terminal coupled to the gate drive output.

In a second example, a system for voltage conversion that provides a regulated DC output voltage includes a voltage converter circuit having a converter input, an auxiliary voltage output, and a converter output. A first resistor has first and second resistor terminals. The first resistor terminal is coupled to the auxiliary voltage output. A second resistor has third and fourth resistor terminals. The third resistor terminal is coupled to the auxiliary voltage output. A current source is coupled between the second resistor terminal and a ground terminal.

An amplifier has first and second amplifier inputs and a first amplifier output. The first amplifier input is coupled to the second resistor terminal, and the second amplifier input is coupled to the fourth resistor terminal. A first transistor is coupled between the fourth resistor terminal and a damping terminal, and has a first control terminal coupled to the first amplifier output.

A gate drive circuit has a gate drive input, a regulated input and a gate drive output. The gate drive input is coupled to the damping terminal, and the regulated input is coupled to the converter output. A second transistor is coupled between the damping terminal and a bootstrap supply terminal, and has a second control terminal coupled to the gate drive output.

DETAILED DESCRIPTION

In this description, the same reference numbers depict same or similar (by function and/or structure) features. The drawings are not necessarily drawn to scale.

In offline switching voltage converters, a high-side FET may be supplied by a bootstrap power supply. In a typical bootstrap power supply, one terminal of a capacitor is connected to a switch node. The bootstrap capacitor is charged through a bootstrap rectifier while a low-side FET is turned on. When the low-side FET is turned off, the bootstrap supply provides a low voltage bias supply to the high side gate driver. The bootstrap rectifier may be specified to provide a fast power-up of the bootstrap capacitor, and to support small low-side turn-on duty cycles.

Gallium nitride (GaN) is a semiconductor material that is well suited for use in power transistors. GaN FETs are sometimes manufactured by growing a thin layer of GaN on an aluminum nitride (AlN) layer of a standard silicon wafer using a process such as metal organic chemical vapor deposition (MOCVD). The AlN layer acts as a buffer between the substrate and the GaN.

Semiconductor materials have a bandgap, which is an energy range in a solid where no electrons can exist. A bandgap is related to how well a solid material can conduct electricity. GaN has a bandgap of 3.4 eV, compared to a bandgap of 1.12 eV for silicon. The wider bandgap of GaN allows a GaN FET to withstand higher voltages and higher temperatures than a similar silicon FET. The ability to operate at higher temperatures and voltages provides certain advantages to the use of GaN in voltage converters.

An enhancement mode FET is normally turned off with no bias voltage being applied between the gate and the source. In contrast to an enhancement mode FET, a depletion mode FET is normally turned on in the absence of a bias voltage. Depletion mode FETs are easier to manufacture in some cases than enhancement mode FETs. However, depletion mode FETs have a disadvantage in power converter applications because a negative gate drive voltage must be applied to turn the FETs off, or else a short circuit can occur between power and ground. An inverting cascode circuit can be added to help overcome the potential shorting issue with depletion mode FETs, but this adds additional circuitry.

Figure 1:
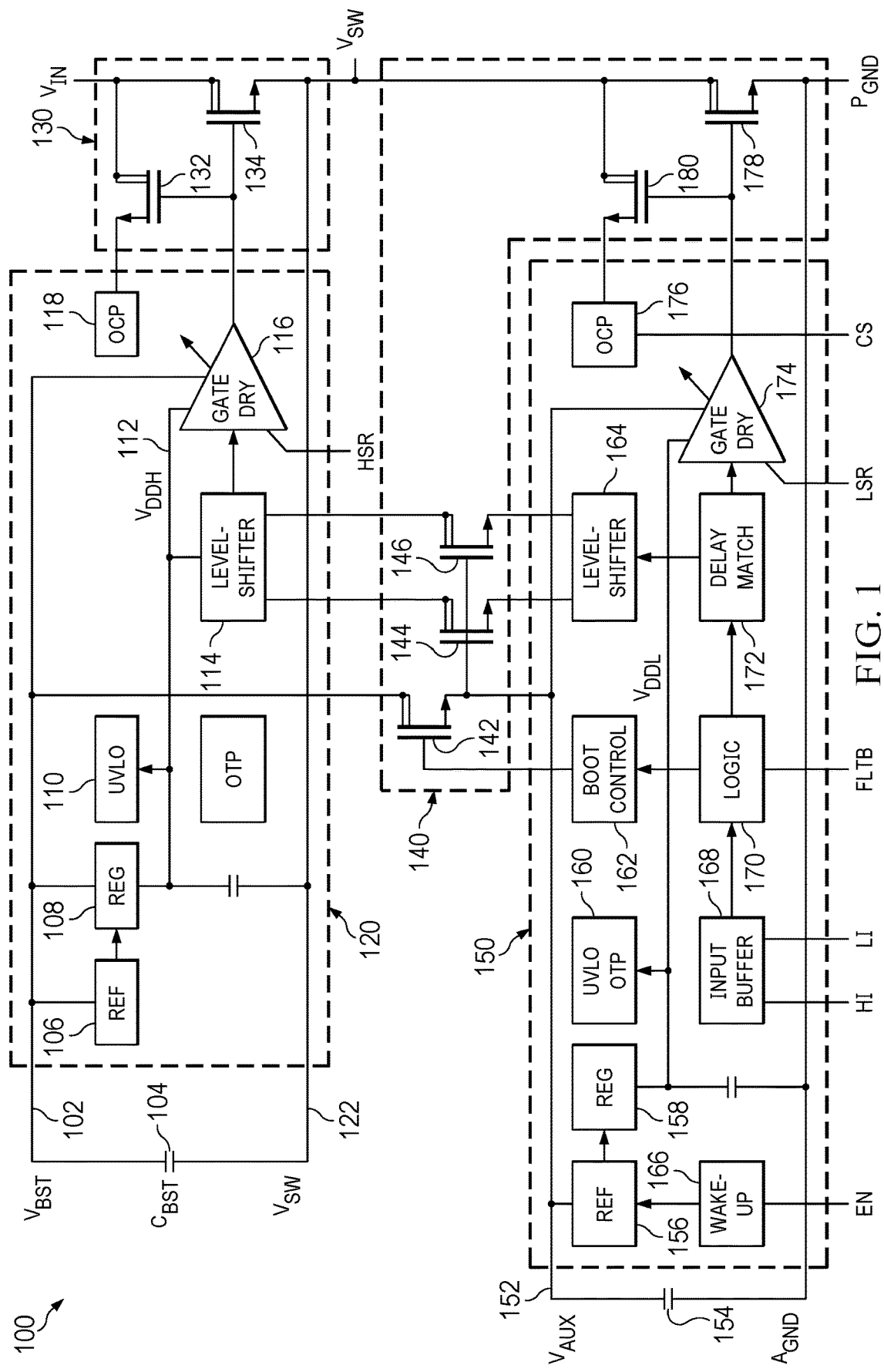
FIG. 1 shows a block diagram of an example offline switching voltage converter.

FIG. 1 shows a block diagram for an example switching voltage converter 100. Switching voltage converter 100 includes a multichip module (MCM) having four dies. The MCM includes a high side GaN die 130, a low side GaN die 140, a high side silicon die 120, and a low side silicon die 150. A bootstrap capacitor 104 is connected between a bootstrap supply terminal $V_{BST}$ 102 and a switching terminal $V_{SW}$ 122. Switching terminal $V_{SW}$ 122 is a connection terminal between a high side FET 134 and a low side FET 178. Bootstrap capacitor 104 may be external to the MCM, or may be integrated into the MCM.

The high side silicon die 120 includes a reference generator circuit 106 coupled to the bootstrap supply terminal $V_{BST}$ 102, a voltage regulator circuit 108 coupled to reference generator circuit 106 and to bootstrap supply terminal $V_{BST}$ 102, and an undervoltage lockout circuit 110 coupled to the output of voltage regulator circuit 108. The high side silicon die 120 further includes a level shifter circuit 114 coupled to the output of voltage regulator circuit 108, a gate drive circuit 116 having an output coupled to the gates of the high side FET 134 and FET 132, and an overcurrent protection circuit 118.

The high side GaN die 130 includes the high side FET 134 coupled between an input voltage terminal $V_{IN}$ and the switching terminal $V_{SW}$ 122. The high side GaN die 130 further includes a FET 132 coupled between the input voltage terminal $V_{IN}$ and the overcurrent protection circuit 118. The low side GaN die 140 includes the low side FET 178 coupled between a ground terminal and the switching terminal $V_{SW}$ 122, and FET 180 coupled between overcurrent protection circuit 176 and the switching terminal $V_{SW}$ 122. The low side GaN die 140 further includes transistors 144 and 146 coupled between level shifter circuit 114 and level shifter circuit 164, and transistor 142 coupled between auxiliary voltage terminal $V_{AUX}$ 152 and the bootstrap supply terminal $V_{BST}$ 102.

The low side silicon die 150 includes a reference voltage circuit 156 coupled to the auxiliary voltage terminal $V_{AUX}$ 152, a voltage regulator circuit 158 coupled to the reference voltage circuit 156, an undervoltage lockout circuit 160 coupled to the output of voltage regulator circuit 158, and a wake up circuit coupled to the reference voltage circuit 156. The low side silicon die 150 further includes a boot control circuit 162 having an output coupled to the gate of transistor 142, an input buffer 168, a logic circuit having a first output coupled to the boot control circuit 162, and the overcurrent protection circuit 176 coupled to FET 180.

The low side silicon die 150 also includes a delay match circuit 172 having an input coupled to a second output of logic circuit 170, and a gate drive circuit 174 having an output coupled to the gates of the low side FET 178 and FET 180. A bootstrap capacitor 104 is connected between a bootstrap supply terminal $V_{BST}$ 102 and a switching terminal $V_{SW}$ 122, which is a connection terminal between a high side FET 134 and a low side FET 178. A capacitor 154 is connected between the auxiliary voltage terminal $V_{AUX}$ 152 and a ground terminal $A_{GND}$. Capacitor 154 may be external to the MCM, or may be integrated into the MCM.

The MCM of switching voltage converter 100 includes four dies, with high voltage isolation being accomplished at package level. The circuitry of switching voltage converter 100 that includes high voltage or high power is placed on one of the GaN dies. The circuitry of switching voltage converter 100 that includes control functions is placed on a silicon die.

A function of the bootstrap supply $V_{BST}$ is to provide a low voltage bias voltage source to the high side driver FET. A high voltage supply is provided by an AC main supply, which is rectified using a bridge rectifier. A low voltage auxiliary supply is typically generated from an auxiliary transformer winding. In a basic configuration, this rectification can be accomplished by a diode connected between the auxiliary supply terminal $V_{AUX}$ and the bootstrap supply terminal $V_{BST}$. However, the use of a diode for this function has several drawbacks.

First, every diode has a forward voltage drop that reduces the bootstrap voltage range by an amount of the diode forward voltage drop. Second, every diode has a reverse recovery. One of the advantages of GaN is that it offers very fast switching slew rates (i.e. 150-200 V/nsec). A GaN FET is capable of achieving these fast slew rates, but the slew rate of the circuit can be limited by the bootstrap rectifier. The bootstrap rectifier is connected in parallel with the high side and low side power FETs, which can create a capacitance that is in parallel with the diode. This capacitance is inherent to the diode, and can limit how fast the FET can switch.

The low side FET is turned on, then the low side FET is turned off. Then the high side FET is turned on, creating a switching transition. At that moment, the bootstrap diode is still forward biased, but then becomes reverse biased as the high side FET turns on. The reverse recovery of the diode limits the slew rate of the drive signal from the FET. Additionally, a parasitic loop inductance can be generated, which may require the addition of a series resistance for damping oscillations. The series resistance may further decrease the slew rate by limiting the maximum current to recharge the bootstrap capacitor, which increases the minimum low side on-time needed to recharge the bootstrap capacitor.

Specifications for switching voltage converters may include a fast switching slew rate and a low duty cycle. Minimizing parasitic capacitance and inductance helps to achieve a fast switching slew rate. Fast recharging of the bootstrap capacitance is also often a requirement for switching voltage converters. A fast high current is helpful for fast recharging of the bootstrap capacitance. GaN FETs provide a low capacitance with no reverse recovery, so they may provide advantages over silicon for the main power FET and the bootstrap rectifier FET.

Figure 2:
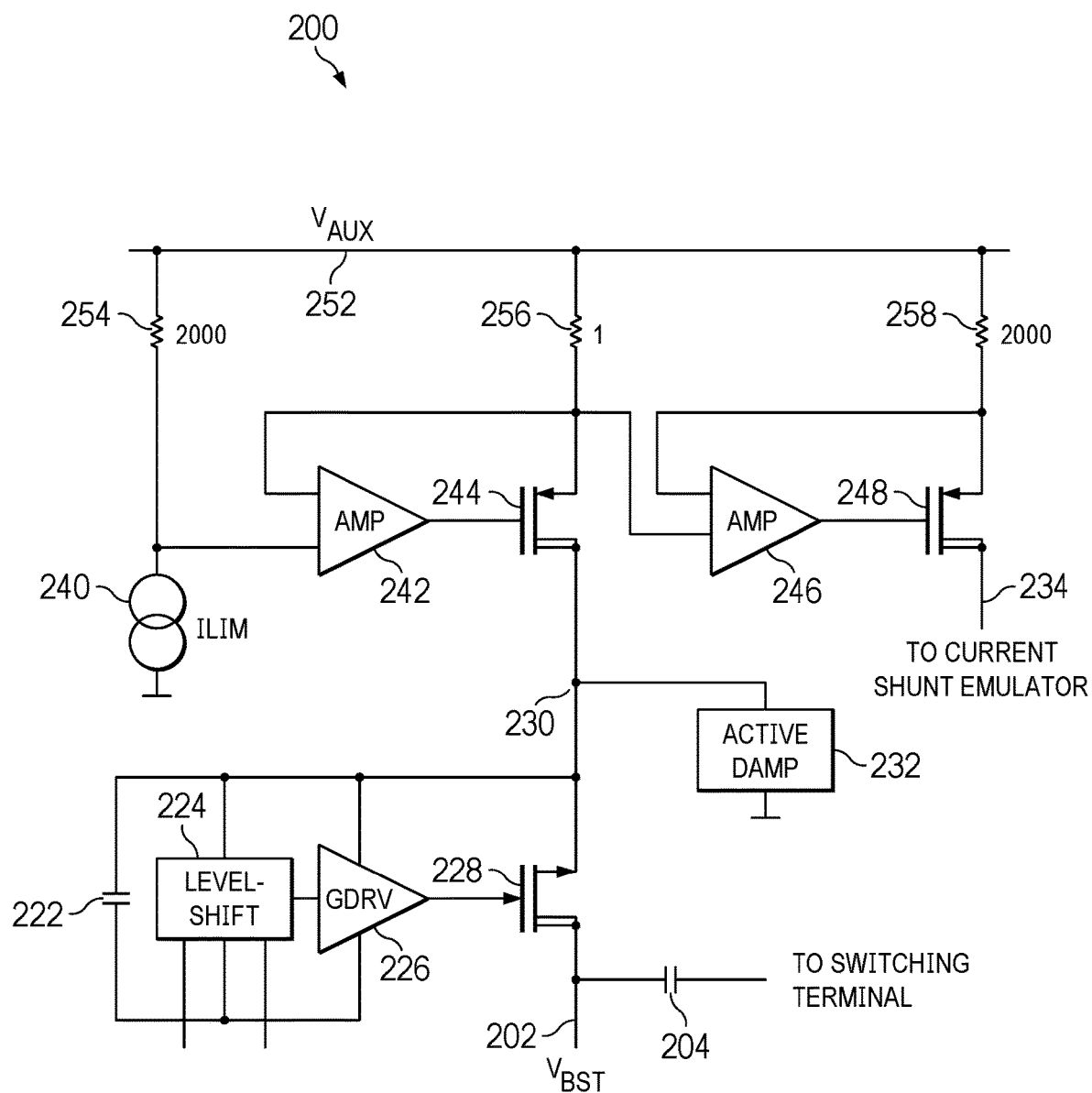
FIG. 2 shows a block diagram for an example bootstrap rectifier circuit.

FIG. 2 shows a block diagram for an example bootstrap rectifier circuit 200. $V_{AUX}$ 252 is a low voltage bias supply supplied by the system. $V_{AUX}$ 252 is a ground referenced supply that provides a loosely regulated voltage that is generated by an auxiliary transformer winding in at least some cases, but may be generated elsewhere. Though $V_{AUX}$ 252 is typically not a tightly regulated voltage, it follows a regulated output voltage and is a loose replica of the regulated output voltage.

Resistors 254, 256 and 258 have respective first leads that are coupled to $V_{AUX}$ 252. In at least one example, resistors 254, 256 and 258 are matched resistors with resistors 254 and 258 having the same resistance, and the resistance of resistor 256 having a ratio of 1:2000 to the resistance of resistor 254. A current source 240 is coupled between a second terminal of resistor 254 and a ground terminal. Amplifier 242 has first and second inputs and an output. The first input of amplifier 242 is coupled to the second terminal of resistor 254, and the second input of amplifier 242 is coupled to the second terminal of resistor 256.

Low-voltage silicon FET 244 has a source that is coupled to the second input of amplifier 242, and has a gate coupled to the output of amplifier 242. Active damp circuit 232 is coupled between the drain of low voltage silicon FET 244 and the ground terminal. Amplifier 246 has first and second inputs and an output. The first input of amplifier 246 is coupled to the second terminal of resistor 256, and the second input of amplifier 242 is coupled to the second terminal of resistor 258. Transistor 248 is coupled between the second input of amplifier 246 and a terminal 234 that can be coupled to a current shunt emulator circuit. The gate of transistor 248 is coupled to the output of amplifier 246.

GaN FET 228 is coupled between the drain of low voltage silicon FET 244 and a bootstrap voltage supply terminal $V_{BST}$ 202. A bootstrap capacitor is coupled between the bootstrap voltage supply terminal $V_{BST}$ 202 and the low side drive FET. Level shift circuit 224 has an input coupled to the drain of low voltage silicon FET 244, and has inputs coupled in parallel with first and second terminals, respectively, of capacitor 222. Level shift circuit 224 has an output coupled to an input of gate drive amplifier 226, and has first and second compensation inputs coupled, respectively, to the first and second terminals of capacitor 222.

Capacitor 222 is an internal bootstrap capacitor for controlling the gate of GaN FET 228. The voltage at the gate of GaN FET 228 is lifted above the voltage of $V_{AUX}$ 252 to charge the external bootstrap capacitor 204 to the voltage of $V_{AUX}$ 252 using an internal bootstrap circuit.

An external bootstrap capacitor 204 is coupled between the bootstrap voltage supply terminal $V_{BST}$ 202 and a switching terminal that connects the high side FET (not shown) to the low side FET (not shown). The external bootstrap capacitor 204 supplies power to the high side FET. The bootstrap rectifier circuit includes low-voltage silicon FET, and GaN FET 228, in a back-to-back series configuration between $V_{AUX}$ 252 and bootstrap voltage supply terminal $V_{BST}$ 202. The low-side FET has a drain connected to the switching terminal, and has a source connected to the ground terminal.

The bootstrap rectifier circuit 200 is not a passive diode rectifier circuit. Instead, an active gate drive amplifier 226 controls the gate of the low side FET. Further, gate drive amplifier 226 switches synchronously with the low side FET. When the low side FET turns on, the bootstrap rectifier turns on. When the low side FET turns off, the bootstrap rectifier turns off. In The bootstrap rectifier circuit 200, gate drive amplifier 226 is synchronous only with the low side, not with the high side.

The bootstrap rectifier circuit 200 has a back-to-back transistor configuration with a GaN FET 228 in series with a low voltage silicon FET 244 between bootstrap voltage supply terminal $V_{BST}$ 202 and $V_{AUX}$ 252. Low voltage silicon FET 244 can be either a PMOS or NMOS FET. The addition of low voltage silicon FET 244 to the circuit helps to solve a problem that can occur during startup. The GaN FET 228 could be configured as a diode with the drain connected to the bootstrap voltage supply terminal $V_{BST}$ 202.

The voltage from the bootstrap voltage supply terminal $V_{BST}$ 202 can initially spike up when the high side FET is turned on, putting a high voltage (e.g. 520 V) on the drain of GaN FET 228, which is blocking current while the high side FET is on. A problem can occur in the reverse direction at device power up if the bootstrap capacitor is completely uncharged, because the gate and drain of GaN FET 228 will have a very high voltage difference. The source is connected to $V_{AUX}$ 252, which could be at around 30V. The gate and drain are connected to the bootstrap voltage supply terminal $V_{BST}$ 202, which could be at around 0V. In this case, the specification for the maximum allowed gate-to-drain voltage would likely be exceeded, destroying the GaN FET 228.

Low voltage silicon FET 244 is added in series with GaN FET 228 between the bootstrap voltage supply terminal $V_{BST}$ 202 and $V_{AUX}$ 252 to limit the maximum gate-drain voltage of GaN FET 228. GaN FET 228 is turned either off or on by the gate drive amplifier 226 synchronously with the low side power FET. Low voltage silicon FET 244 limits the current flowing through GaN FET 228 to protect it from damage due to an overcurrent condition without the addition of a series resistor, which allows for faster recharge of the bootstrap capacitor.

Current source ILIM provides a reference current that corresponds to a specified current limit. Resistors 254 and 256 are matched resistors of 2000 ohms and 1 ohm, respectively. Amplifier 242 has a first input coupled to resistor 254, and has a second input coupled to resistor 256. The output of amplifier 242 is coupled to the gate of low voltage silicon FET 244. The respective voltage drops across resistor 254 and across resistor 256 are the first and second inputs, respectively, to amplifier 242. Amplifier 242 provides an active feedback loop driving its two inputs to the same voltage. The output of amplifier 242 controls how hard the low voltage silicon FET 244 is turned on, and thus how much current flows through low voltage silicon FET 244. This provides a regulated current limit for low voltage silicon FET 244.

The feedback through amplifier 242 provides continuous information of how much current is being used for charging the bootstrap capacitor. This information is available for processing by other components for other purposes. As an example, if the bootstrap charging current is known, it can be subtracted from the total current to calculate the inductor current. Knowing the current through the inductor can be useful for other system functions.

Resistor 258 is matched to resistor 254 and has the same resistance. A first input of amplifier 246 is coupled to resistor 258. A second input of amplifier 246 is coupled to resistor 256. The output of amplifier 246 is coupled to the gate of transistor 248 and controls the flow of current through transistor 248. Amplifier 246 provides an active feedback loop, driving its two inputs to the same voltage. This regulates the current through transistor 248 to be equal to the current through low voltage silicon FET 244, making the current through transistor 248 a replica of the current through low voltage silicon FET 244.

The feedback loop that includes amplifier 242 is used for current limiting, and the feedback loop that includes amplifier 246 is used for generating a replica of the current for charging the bootstrap capacitor. The replica current at terminal 234 from transistor 248 can be provided to other system components, such as a current shunt emulator, for further processing.

Active damp circuit 232 can be implemented with a single switch, and is added to solve a potential problem. In some cases, the voltage at the bootstrap voltage supply terminal $V_{BST}$ 202 can rise steeply (e.g. 150 V/nsec). There can be loop inductances due to bond wires and parasitic capacitances within the printed circuit board, which can produce oscillations when excited with a steep pulse. A series resistance can be added to the circuit to damp the oscillations. However, the addition of a series resistance will increase the minimum recharging time for the bootstrap capacitor.

Active damp circuit 232 provides active damping of any oscillations that may occur without adding any resistance to the loop. The active damp circuit includes a MOSFET switch coupled between terminal 230 and ground. The gate of the MOSFET switch is switched to ground through an inverter. The MOSFET switch is turned on when the bootstrap rectifier is turned off.

Figure 3:
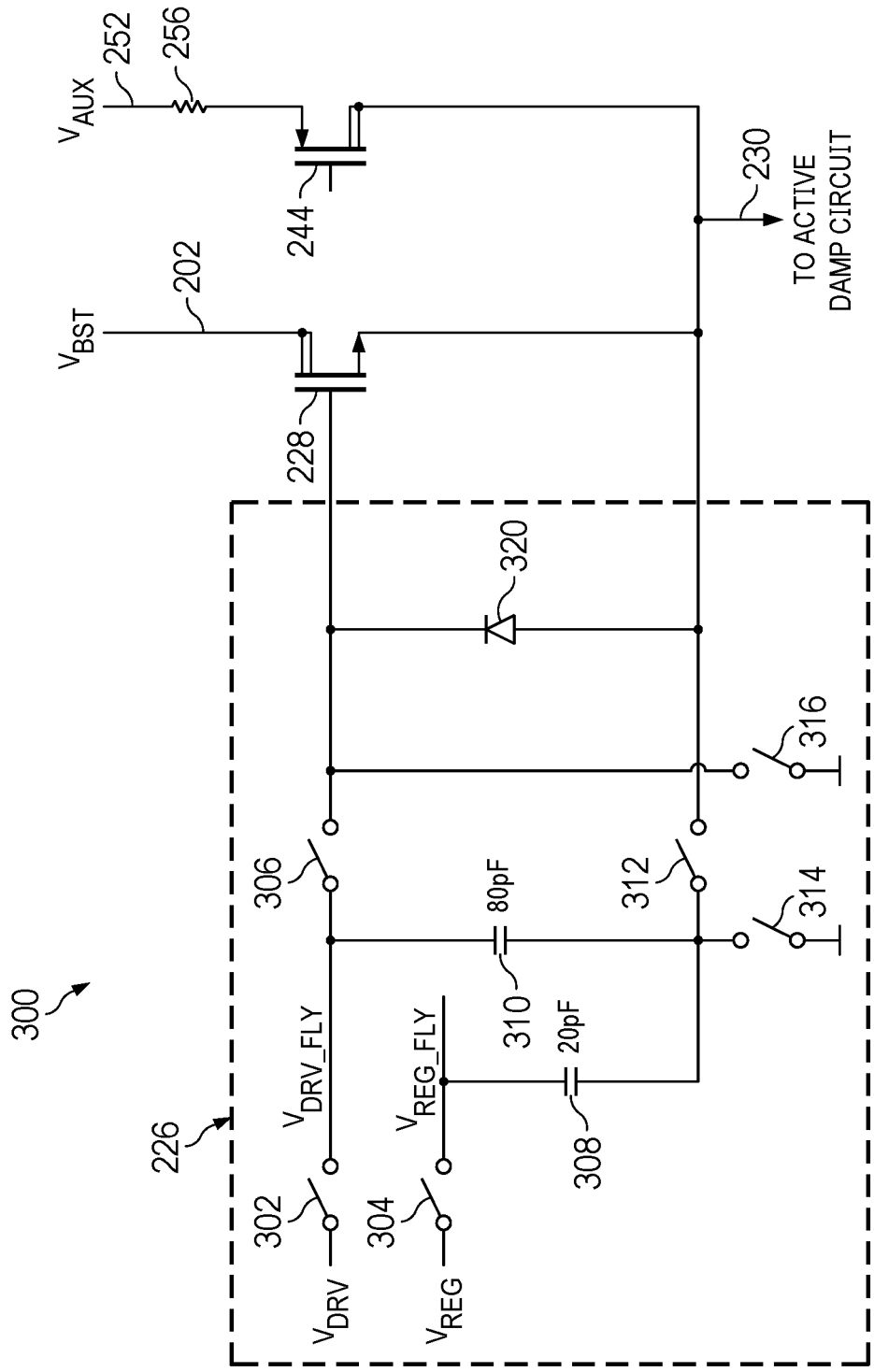
FIG. 3 shows a block diagram for an example gate driver circuit.

FIG. 3 shows a block diagram for an example gate drive circuit 300. Gate drive circuit 300 includes gate drive amplifier 226, GaN FET 228 and low voltage silicon FET 244. A drive voltage terminal $V_{DRV}$ is coupled to a first terminal of switch 302. A second terminal of switch 302 is coupled to a first terminal of switch 306. A second terminal of switch 306 is coupled to the gate of GaN FET 228. GaN FET 228 is coupled between the bootstrap voltage supply terminal $V_{BST}$ 202 and terminal 230, which is coupled to the active damp circuit 232. Resistor 256 has a first terminal coupled to $V_{AUX}$ 252. Low voltage silicon FET 244 is coupled between a second terminal of resistor 256 and terminal 230.

A regulated output voltage terminal $V_{REG}$ is coupled to a first terminal of switch 304. Capacitor 308 is coupled between a second terminal of switch 304 and a first terminal of switch 312. Capacitor 310 is coupled between the first terminal of switch 306 and the first terminal of switch 312. Switch 314 is coupled between the first terminal of switch 312 and ground. Switch 316 is coupled between the second terminal of switch 306 and ground. Switches 302 and 306 are controlled by internal logic, and open and close to synchronize the turning on and off of GaN FET 228 with the turning on and off of the low side FET.

In this description, "terminal," "node," "interconnection," "lead" and "pin" are used interchangeably. Unless specifically stated to the contrary, these terms generally mean an interconnection between or a terminus of a device element, a circuit element, an integrated circuit, a device, or other electronics or semiconductor component.

In this description, "ground" includes a chassis ground, an Earth ground, a floating ground, a virtual ground, a digital ground, a common ground and/or any other form of ground connection applicable to, or suitable for, the teachings of this description.

In this description, even if operations are described in a particular order, some operations may be optional, and the operations are not necessarily required to be performed in that particular order to achieve specified results. In some examples, multitasking and parallel processing may be advantageous. Moreover, a separation of various system components in the embodiments described above does not necessarily require such separation in all embodiments.

Modifications are possible in the described embodiments, and other embodiments are possible, within the scope of the claims.

What is claimed is:

1. A rectifier circuit comprising:
a first resistor having first and second resistor terminals, the first resistor terminal coupled to an auxiliary power terminal;
a second resistor having third and fourth resistor terminals, the third resistor terminal coupled to the auxiliary power terminal;
a current source coupled between the second resistor terminal and a ground terminal;
an amplifier having first and second amplifier inputs and a first amplifier output, the first amplifier input coupled to the second resistor terminal, and the second amplifier input coupled to the fourth resistor terminal;
a first transistor coupled between the fourth resistor terminal and a damping terminal, and having a first control terminal coupled to the first amplifier output;
a gate drive circuit having a gate drive input and a gate drive output, the gate drive input coupled to the damping terminal; and
a second transistor coupled between the damping terminal and a bootstrap supply terminal, and having a second control terminal coupled to the gate drive output.

2. The rectifier circuit of claim 1, wherein the gate drive circuit includes:
a capacitor having first and second capacitor terminals, the first capacitor terminal coupled to the damping terminal;
a level shift circuit having first and second level shift inputs and a level shift output, the first and second level shift inputs coupled to the first and second capacitor terminals, respectively; and
a driver having a driver input and a driver output, the driver input coupled to the level shift output, and the driver output coupled the second control terminal.

3. The rectifier circuit of claim 1, wherein the amplifier is a first amplifier, and the rectifier circuit further comprising:
a third resistor having fifth and sixth resistor terminals, the fifth resistor terminal coupled to the auxiliary power terminal;
a second amplifier having third and fourth amplifier inputs and a second amplifier output, the third amplifier input coupled to the sixth resistor terminal, and the fourth amplifier input coupled to the second amplifier input; and
a third transistor coupled between the sixth resistor terminal and a current shunt terminal, and having a third control terminal coupled to the second amplifier output.

4. The rectifier circuit of claim 3, wherein a current through the third transistor is equal to a current through the first transistor.

5. The rectifier circuit of claim 1, wherein the second transistor is a Gallium Nitride (GaN) FET.

6. The rectifier circuit of claim 1, wherein the second transistor switches synchronously with a low side drive transistor of a voltage regulator circuit.

7. The rectifier circuit of claim 1, wherein the first transistor and the second transistor are on separate dies in a multichip module.

8. The rectifier circuit of claim 1, wherein the current through the second transistor is limited by a circuit that includes the first and second resistors, the amplifier, the current source and the first transistor.

9. The rectifier circuit of claim 8, wherein a limit for the current through the second transistor is proportional to a current provided by the current source.

10. The rectifier circuit of claim 1, further comprising an active damp circuit coupled between the damping terminal and the ground terminal, the active damp circuit including a field effect transistor (FET).

11. A system for voltage conversion providing a regulated DC output voltage, the system comprising:
a voltage converter circuit having a converter input, an auxiliary voltage output, and a converter output;
a first resistor having first and second resistor terminals, the first resistor terminal coupled to the auxiliary voltage output;
a second resistor having third and fourth resistor terminals, the third resistor terminal coupled to the auxiliary voltage output;
a current source coupled between the second resistor terminal and a ground terminal;
an amplifier having first and second amplifier inputs and a first amplifier output, the first amplifier input coupled to the second resistor terminal, and the second amplifier input coupled to the fourth resistor terminal;
a first transistor coupled between the fourth resistor terminal and a damping terminal, and having a first control terminal coupled to the first amplifier output;
a gate drive circuit having a gate drive input, a regulated input and a gate drive output, the gate drive input coupled to the damping terminal, and the regulated input coupled to the converter output; and
a second transistor coupled between the damping terminal and a bootstrap supply terminal, and having a second control terminal coupled to the gate drive output.

12. The system of claim 11, wherein the gate drive circuit includes:
a capacitor having first and second capacitor terminals, the first capacitor terminal coupled to the damping terminal;
a level shift circuit having first and second level shift inputs and a level shift output, the first and second level shift inputs coupled to the first and second capacitor terminals, respectively; and
a driver having a driver input and a driver output, the driver input coupled to the level shift output, and the driver output coupled the second control terminal.

13. The system of claim 11, wherein the amplifier is a first amplifier, and the system further comprising:
a third resistor having fifth and sixth resistor terminals, the fifth resistor terminal coupled to the auxiliary voltage output;
a second amplifier having third and fourth amplifier inputs and a second amplifier output, the third amplifier input coupled to the sixth resistor terminal, and the fourth amplifier input coupled to the second amplifier input; and
a third transistor coupled between the sixth resistor terminal and a current shunt terminal, and having a third control terminal coupled to the second amplifier output.

14. The system of claim 13, wherein a current through the third transistor is equal to a current through the first transistor.

15. The system of claim 11, wherein the second transistor is a Gallium Nitride (GaN) FET.

16. The system of claim 11, wherein the second transistor switches synchronously with a low side drive transistor in the voltage converter circuit.

17. The system of claim 11, wherein the first transistor and the second transistor are on separate dies in a multichip module.

18. The system of claim 11, wherein the current through the second transistor is controlled and limited by a circuit that includes the first and second resistors, the amplifier, the current source and the first transistor.

19. The system of claim 18, wherein a limit for the current through the second transistor is proportional to a current provided by the current source.

20. The system of claim 11, further comprising an active damp circuit coupled between the damping terminal and the ground terminal, the active damp circuit including a FET.

* * * * *